(12) United States Patent
Albertini

(10) Patent No.: US 11,431,166 B2
(45) Date of Patent: Aug. 30, 2022

(54) ELECTROSTATIC DISCHARGE PROTECTION IN A MONOLITHIC GATE DRIVER HAVING MULTIPLE VOLTAGE DOMAINS

(71) Applicant: Infineon Technologies Austria AG, Villach (AT)

(72) Inventor: Matteo Albertini, Pavia (IT)

(73) Assignee: Infineon Technologies Austria AG

( * ) Notice: Subject to any disclaimer, the term of this patent is extended or adjusted under 35 U.S.C. 154(b) by 329 days.

(21) Appl. No.: 16/838,379

(22) Filed: Apr. 2, 2020

(65) Prior Publication Data

US 2021/0313801 A1 Oct. 7, 2021

(51) Int. Cl.
*H02H 9/04* (2006.01)
*H03K 3/017* (2006.01)
*H02H 1/00* (2006.01)

(52) U.S. Cl.
CPC .......... *H02H 9/046* (2013.01); *H02H 1/0007* (2013.01); *H03K 3/017* (2013.01)

(58) Field of Classification Search
CPC ........ H02H 9/046; H02H 1/0007; H02H 9/04; H03K 3/017; G06N 3/02; H02M 1/0006; H02M 1/088; H02M 1/32; H02M 7/5387; H02P 29/02; H02P 21/10; H02P 21/08

USPC .......................................................... 361/56
See application file for complete search history.

(56) References Cited

U.S. PATENT DOCUMENTS

| | | | |
|---|---|---|---|
| 10,224,817 B1 * | 3/2019 | Sharma | H02M 3/1588 |
| 10,236,877 B1 * | 3/2019 | Sharma | H03K 17/063 |
| 2013/0278301 A1 * | 10/2013 | Huynh | H01L 29/7835 327/108 |
| 2015/0077886 A1 * | 3/2015 | Chen | H02H 9/046 361/56 |
| 2020/0044648 A1 * | 2/2020 | Sharma | H03K 17/063 |

* cited by examiner

*Primary Examiner* — Dharti H Patel
(74) *Attorney, Agent, or Firm* — Design IP

(57) ABSTRACT

A gate driver integrated circuit includes a high-side region that operates in a first voltage domain according to a first pair of supply terminals that include a first lower supply terminal and a first higher supply terminal; a low-side region that operates in a second voltage domain according to a second pair of supply terminals; a low-voltage region the operates in a third voltage domain; at least one termination region that electrically isolates the high-side region from the low-side region and the low-voltage region; a first electrostatic device arranged in the high-side region and connected to the first pair of supply terminals; a second electrostatic device arranged in the low-side region and connected to the second pair of supply terminals; and a third electrostatic device connected to a lower supply terminal of the first pair of supply terminals and is coupled in series with the first electrostatic device.

25 Claims, 4 Drawing Sheets

ELECTROSTATIC DISCHARGE PROTECTION IN A MONOLITHIC GATE DRIVER HAVING MULTIPLE VOLTAGE DOMAINS

BACKGROUND

A high voltage (HV) gate driver circuit may include a low voltage (LV) gate driver used to drive a low-side transistor switch and an HV gate driver used to drive a high-side transistor switch. The LV gate driver is arranged in a low voltage domain, whereas the HV gate driver is arranged in a high voltage domain. In practice, the gate driver also includes a termination region that isolates the high voltage domain from the low voltage domain, and may be referred to as an isolation termination region. Thus, the termination region provides a voltage isolation barrier between the two voltage domains.

Electrostatic discharge (ESD) protection is typically needed for all pads of an integrated circuit (IC). However, ESD protection consumes area and cost due to silicon usage. A voltage rating of an ESD device is the voltage difference between its input and out terminals. The larger the voltage rating of an ESD device, the more die area is needed for the ESD device. Thus, the higher the cost.

Therefore, providing ESD protection between multiple voltage domains at a smaller footprint and at a lower cost may be desirable.

SUMMARY

Embodiments provide a gate driver integrated circuit, including: a high-side region that operates in a first voltage domain according to a first pair of supply terminals that include a first lower supply terminal and a first higher supply terminal; a low-side region that operates in a second voltage domain lower than the first voltage domain according to a second pair of supply terminals that include a second lower supply terminal and a second higher supply terminal; a low-voltage region the operates in a third voltage domain lower than the second voltage domain; at least one termination region that electrically isolates the high-side region from the low-side region and the low-voltage region; a first electrostatic device arranged in the high-side region and connected to the first pair of supply terminals; a second electrostatic device arranged in the low-side region and connected to the second pair of supply terminals; and a third electrostatic device connected to the first lower supply terminal of the first pair of supply terminals such that the third electrostatic device is coupled in series with the first electrostatic device.

Embodiments provide a method of operating a gate driver integrated circuit. The method includes: operating at least one high-side device in a first voltage domain according to a first pair of supply terminals that include a first lower supply terminal and a first higher supply terminal; operating at least one low-side device in a second voltage domain lower than the first voltage domain according to a second pair of supply terminals that include a second lower supply terminal and a second higher supply terminal; operating at least one low-voltage device in a third voltage domain lower than the second voltage domain, wherein the high-side region is isolated from the low-side region and the low-voltage region; providing a first electrostatic protection to the at least one high-side device based on a first electrostatic device arranged in the first voltage domain and connected to the first pair of supply terminals and based on a second electrostatic device connected to the first lower supply terminal of the first pair of supply terminals such that the third electrostatic device is coupled in series with the first electrostatic device; and providing a second electrostatic protection to the at least one low-side device based on a third electrostatic device arranged in the second voltage domain and connected to the second pair of supply terminals.

BRIEF DESCRIPTION OF THE DRAWINGS

Embodiments are described herein making reference to the appended drawings.

DETAILED DESCRIPTION

Figure 1:
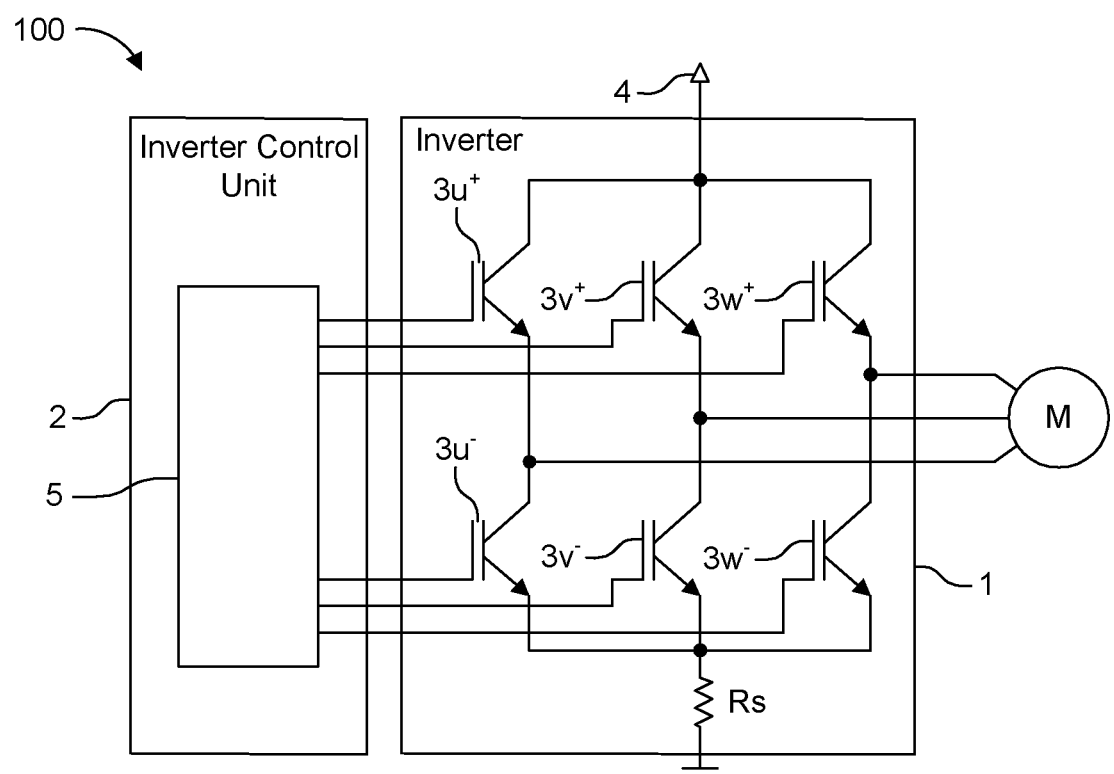
FIG. 1 is a schematic block diagram illustrating a control actuator 10 of a power semiconductor device according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration. It is to be understood that other embodiments may be utilized and structural or logical changes may be made without departing from the scope defined by the claims. The following detailed description, therefore, is not to be taken in a limiting sense. Directional terminology used in the claims may aid in defining one element's spatial or positional relation to another element or feature, without being limited to a specific orientation.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The terms "substantially" and "approximately" may be used herein to account for small manufacturing tolerances (e.g., within 5%) that are deemed acceptable in the industry without departing from the aspects of the embodiments described herein. For example, a resistor with an approximate resistance value may practically have a resistance within 5% of that approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

One or more aspects of the present disclosure may be implemented as a non-transitory computer-readable recording medium having recorded thereon a program embodying methods/algorithms for instructing the processor to perform the methods/algorithms. Thus, a non-transitory computer-readable recording medium may have electronically readable control signals stored thereon, which cooperate (or are capable of cooperating) with a programmable computer system such that the respective methods/algorithms are performed. The non-transitory computer-readable recording medium can be, for example, a CD-ROM, DVD, Blu-ray disc, a RAM, a ROM, a PROM, an EPROM, an EEPROM, a FLASH memory, or an electronic memory device.

Each of the elements of the present disclosure may be configured by implementing dedicated hardware or a software program on a memory controlling a processor to perform the functions of any of the components or combinations thereof. Any of the components may be implemented as a central processing unit (CPU) or other processor reading and executing a software program from a recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPGAs), programmable logic controller (PLC), or other equivalent integrated or discrete logic circuitry.

Accordingly, the term "processor," as used herein refers to any of the foregoing structures or any other structure suitable for implementation of the techniques described herein. A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor structure configured to conduct a load current along a load current path between two load terminal structures or load electrodes (e.g., the source/emitter and the drain/collector) of the device. Further, the load current path may be controlled by means of a control electrode, sometimes referred to as gate electrode. For example, upon receiving a corresponding control signal from, e.g., a driver unit, the control electrode may set the power semiconductor device in one of a conducting state or a blocking state. A control signal may by a voltage signal or a current signal having a controlled value.

A power transistor, also referred to as a power switch or a transistor switch, is a power semiconductor device that may be used to drive a load current. For example, an IGBT is turned "ON" or "OFF" by activating and deactivating its gate terminal. Applying a positive input voltage signal across the gate and the emitter will keep the device in its "ON" state, while making the input gate signal zero or slightly negative will cause it to turn "OFF". There is a turn-on process and a turn-off process for switching the power transistor on and off.

During the turn-on process, a gate driver integrated circuit (IC) may be used to provide (source) a gate current (i.e., an ON current) to the gate of the power transistor in order to charge the gate to a sufficient voltage to turn on the device. In particular, current Io+ is a gate driver output current used to rise (i.e., charge) the gate of the power transistor during a turn on transient. Thus, it is used to turn on the power transistor.

In contrast, during the turn-off process, the gate driver IC is used to draw (sink) a gate current (i.e., an off current) from the gate of the power transistor in order to discharge the gate sufficiently to turn off the device. Current Io− is a gate driver output current used to discharge the gate of the power transistor during a turn off transient. Thus, it is used to turn off the power transistor.

A voltage pulse may be output from the gate driver IC as the control signal according to a pulse width modulation (PWM) scheme. Thus, the control signal may be switched between an ON voltage level and an OFF voltage level during a PWM cycle for controlling a power transistor. This in turn charges and discharges the gate voltage to turn on and off the power transistor, respectively.

In particular, the gate of a power transistor is a capacitive load, and the turn ON current (i.e., gate sourcing current) and the turn OFF current (i.e., gate sinking current) are specified as the initial current when a switching event is initiated. During a turn OFF event, after some small amount of time (small compared to the PWM period), the gate current decreases and reaches a zero value when the gate reaches, for example, 0V. During a turn ON event, after some small amount of time (small compared to the PWM period), the gate current decreases and reaches a zero value when the gate reaches, for example, 15V.

Transistors may include Insulated Gate Bipolar Transistors (IGBTs) and Metal Oxide Semiconductor Field Effect Transistors (MOSFETs) (e.g., Si MOSFETs or SiC MOSFETs). While IGBTs may be used as an example in the embodiments below, it will be appreciated that MOSFETs may be substituted for the IGBTs and vice versa. In this context, when substituting a MOSFET for an IGBT, a MOSFET's drain may be substituted for an IGBT's collector, the MOSFET's source may be substituted for the IGBT's emitter, and the MOSFETs drain-source voltage VDS may be substituted for the IGBT's collector-emitter voltage VCE in any one of the examples described herein. Thus, any IGBT module may be substituted by a MOSFET module and vice versa.

Specific embodiments described herein pertain to, without being limited thereto, a power semiconductor device that may be used within a power converter or a power supply. Thus, in an embodiment, the power semiconductor device may be configured to carry a load current that is to be supplied to a load and/or, respectively, that is provided by a power source. For example, the semiconductor device may comprise one or more power semiconductor cells, such as a monolithically integrated diode cell, and/or a monolithically integrated transistor cell. Such diode cell and/or such transistor cells may be integrated in a power semiconductor module.

Power semiconductor devices that include transistors which are suitably connected to form half-bridges are commonly used in the field of power electronics. For example, half-bridges may be used for driving electric motors or switched mode power supplies.

For example, a multi-phase inverter is configured to provide multi-phase power by supplying multiple phase loads (e.g., a three-phase motor). For instance, three-phase power involves three symmetrical sine waves that are 120 electrical degrees out of phase with one another. In a symmetric three-phase power supply system, three conductors each carry an alternating current (AC) of the same frequency and voltage amplitude relative to a common reference but with a phase difference of one third the period. Due to the phase difference, the voltage on any conductor reaches its peak at one third of a cycle after one of the other conductors and one third of a cycle before the remaining conductor. This phase delay gives constant power transfer to a balanced linear load. It also makes it possible to produce a rotating magnetic field in an electric motor.

A three-phase inverter includes three inverter legs, one for each of the three phases, and each inverter leg is connected to a direct current (DC) voltage source in parallel to each other. Each inverter leg includes a pair of power transistors, for example, arranged in a half-bridge configuration for converting DC to AC. In other words, each inverter leg includes two complementary transistors (i.e., a high-side transistor and a low-side transistor) connected in series and which switch on and off complementary to the each other for driving a phase load.

FIG. 1 is a schematic block diagram illustrating a control actuator 10 of a power semiconductor device according to one or more embodiments. In this example, the control actuator 100 is a motor control actuator for controlling and driving a motor. However, it will be appreciated that the control actuator 100 may control and/or drive other types of loads. As such, FIG. 1 illustrates a non-limiting example of one use of the control actuator with the motor being one possible type of load.

The control actuator 10 includes a power inverter 1 and an inverter control unit 2. The inverter control unit 2 behaves as a control unit (e.g., motor control unit) and thus may also be referred to as a controller or a control IC (e.g., a motor controller or motor control IC). The control unit may be a monolithic IC or may be split into a microcontroller and a gate driver on two or more ICs.

In this example, the control actuator 10 is further coupled to a three-phase motor M, that includes three phases U, V, and W. The power inverter 1 is a three-phase current generator configured to provide three-phase power by supplying three phase currents to drive the motor M. It will be further appreciated that the power inverter 1 and the inverter control unit 2 may be placed on a same circuit board, or on separate circuit boards.

Deviations in both magnitude and phase may case a loss in power and torque in the motor M. Therefore, the control actuator 10 may be configured to monitor and control the magnitude and phase of the currents supplied to the motor M in real-time to ensure the proper current balance is maintained based on a feedback control loop. Open loop motor control units also exist and may be implemented.

The power inverter 1 includes a switching array of six transistor modules $3u+$, $3u-$, $3v+$, $3v-$, $3w+$, and $3w-$ (collectively referred to as transistor modules 3) arranged in complementary pairs. Each complementary pair constitutes one inverter leg that supplies a phase current to the three-phase motor M. Thus, each inverter leg includes an upper (high-side) transistor module 3 and a lower (low-side) transistor module 3. Each transistor module may include one transistor, and may also include a diode (not shown). Thus, each inverter leg includes an upper transistor (i.e., a high-side switch) and a lower transistor (i.e., a low-side switch). Load current paths U, V, and W extend from an output of each inverter leg (i.e., the output of each half-bridge) located between complementary transistors and are configured to be coupled to a load, such as motor M. The power inverter 1 is coupled to a DC power supply 4 (e.g., a battery or a diode bridge rectifier) and to the inverter control unit 2.

In this example, the inverter control unit 2 includes a motor control circuit and a gate driver circuit for controlling the switching array. In some examples, the inverter control unit 2 may be monolithic in which the motor control circuit and gate driver circuit are integrated onto a single die. In other examples, the motor control circuit and gate driver circuit may be partitioned as separate ICs. A monolithic gate driver is a gate driver on a single silicon chip and may be further made with specific high voltage (HV) technology. Furthermore, the gate driver IC may be integrated on the power inverter 1 to form a power module.

The controller IC performs the control function of the control actuator 10 in real-time. When driving a motor, the control function is a motor control function can include either controlling a permanent magnet motor or an induction motor and can be configured as a sensorless control not requiring the rotor position sensing, as a sensor based control with Hall sensors and/or an encoder device, or as a combination of both sensor based control (e.g., used at lower rotor speeds) and sensorless control (e.g., used at higher rotor speeds).

For example, the inverter control unit 2 includes a controller and driver unit 5 that includes a microcontroller unit (MCU) as the controller IC and a gate driver IC for generating driver signals for controlling the transistors of each transistor module 3. Thus, load current paths U, V, and W may be controlled by the controller and driver unit 5 by means of controlling the control electrodes (i.e., gate electrodes) of the transistors 3. For example, upon receiving a control signal from the microcontroller, the gate driver IC may set a corresponding transistor in one of a conducting state (i.e., on-state) or a blocking state (i.e., off-state).

The gate driver IC may be configured to receive instructions, including the power transistor control signals, from the MCU, and turn on or turn off respective transistors 3 in accordance with the received instructions and control signals. For example, during the turn-on process of a respective transistor 3, the gate driver IC may be used to provide (source) a gate current to the gate of the respective transistor 3 in order to charge the gate. In contrast, during the turn-off process, the gate driver IC may be used to draw (sink) a gate current from the gate of the transistor 3 in order to discharge the gate.

The inverter control unit 2 or the controller and driver unit 5 itself may include a PWM controller, an ADC, a DSP, and/or a clock source (i.e., a timer or counter) used in implementing a PWM scheme for controlling the states of each transistor, and, ultimately, each phase current provided on the respective load current paths U, V, and W.

In particular, the microcontroller of the controller and driver unit 5 may use a motor control algorithm, such as a field-oriented control (FOC) algorithm, for providing current control in real-time for each phase current output to a multi-phase load, such a multi-phase motor. For example, during FOC, a motor phase current should be measured such that an exact rotor position can be determined in real-time. To implement the determination of the motor phase current, the MCU 5 may employ an algorithm (e.g., space vector modulation (SVM), also referred as space vector pulse width modulation (SVPWM)) that uses single-shunt current sensing.

Furthermore, the switches 3 (i.e., transistors) of the power inverter 1 are controlled so that at no time are both switches in the same inverter leg turned on or else the DC supply would be shorted. This requirement may be met by the complementary operation of the switches 3 within an inverter leg according to the motor control algorithm.

Figure 2:
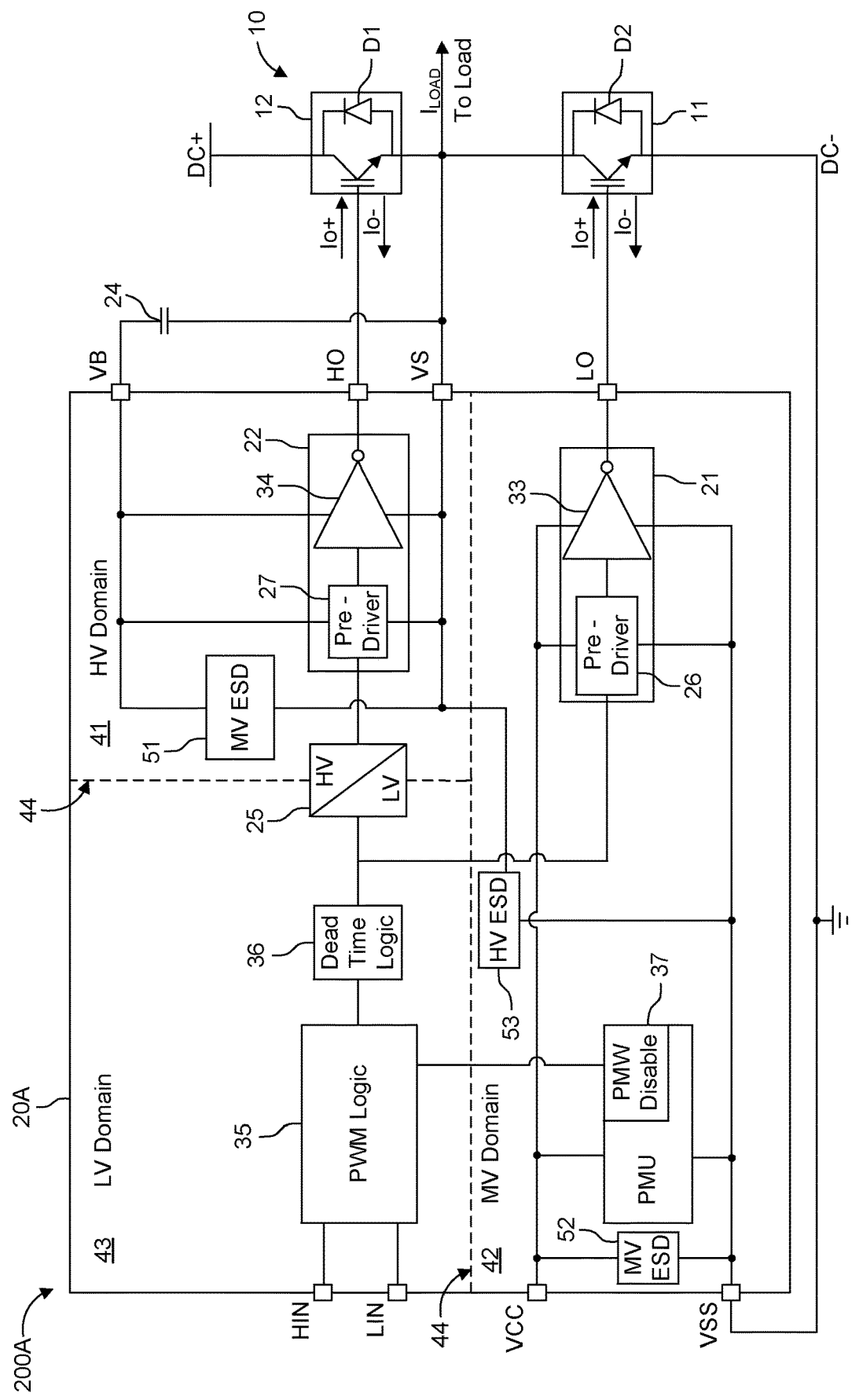
FIG. 2 is a schematic block diagram of a first power module according to one or more embodiments.

FIG. 2 is a schematic block diagram of a power module 200A according to one or more embodiments. The power module 200A includes a single-phase drive stage 10 (i.e., an inverter leg) and a gate driver IC 20A electrically coupled to the single-phase drive stage 10. However, the single-phase drive stage may be expanded to a multiple-phase drive state by adding additional inverter legs. Both the single-phase drive stage 10 and the gate driver IC 20A are integrated into a single package (not illustrated). Thus, the power module 200A is packaged as a single device.

The single-phase drive stage 10 includes a low-side transistor 11 and a high-side transistor 12 that are controlled for supplying a load current $I_{LOAD}$ to a one phase of a load (not illustrated). Freewheeling diodes D1 and D2 coupled to their respective power transistors 11 and 12 are also shown.

The gate driver IC 20A is a monolithic high voltage (HV) gate driver, that includes a low-side (LS) gate driver 21 used to drive the low-side transistor switch 11 and a high-side (HS) gate driver 22 used to drive the high-side transistor switch 12. As will be explained later, the LS gate drive 21 and the HS gate driver 22 are located in different voltage domains of the gate driver IC 20A.

Both gate drivers 21 and 22 perform gate driving of their respective power transistor 11 and 12 based on digital PWM signals LIN and HIN received from a microcontroller unit (MCU). The PWM signals are control signals received from the MCU at PWM logic 35 of the gate driver IC 20A. The PWM logic 35 receives the LIN and HIN signals from the MCU and dead time logic 36 (e.g., a delay circuit) ensures there is a minimum dead time implemented to prevent bridge shoot through. In some implementations, the dead time logic 36 may be integrated in the PWM logic 35. Eventually, the respective PWM control signals are passed on to the respective low-side and high-side gate driver 21 and 22, where the PWM signal HIN to the high-side gate driver 22 is passed through a low-voltage (LV) to high-voltage (HV) (LV/HV) level shifter 25. After this point, the low-side and high-side gate driver 21 and 22 perform gate driving.

LV/HV level shifter 25 is configured to convert a low-voltage signal into its higher-voltage equivalent. For example, a logic low LV signal may be converted into a logic low HV signal. Similarly, a logic high LV signal may be converted into a logic high HV signal. This enables signals to be transmitted across different voltage domains.

Both gate drivers 21 and 22 include separate pre-driver circuitry 26 and 27 and buffers 33 and 34, respectively. The pre-driver circuitries 26 and 27 are configured to receive the PWM signals and, based thereon, control the on/off state of a respective first current source, such as a source FET, used to generate current Io+. Additionally, the pre-driver circuitries 26 and 27 are configured to receive the PWM signals and, based thereon, control the on/off state of a respective second current source, such as a sink FET, used to generate current Io–. The respective current sources are provided in buffers 33 and 34. Thus, the buffers 33 and 34 may each include a pair of complementary FETs used to generate turn-on currents Io+ and turn-off currents Io– for their respective power transistor 11 and 12. Each of the pre-driver circuitries 26 and 27 may further command a respective buffer 33 or 34 to use a certain current capability.

The low-side gate driver 21 is arranged in a low-side region defined by a medium voltage domain, whereas the high-side gate driver is arranged in high-side region defined by a high voltage domain. In practice, the gate driver IC 20A also includes a termination region that isolates the high voltage domain from the low voltage domain, and may be referred to as an isolation termination region. Thus, the termination region provides a voltage isolation barrier between the two voltage domains.

The gate driver IC 20A may be configured to receive PWM control signals, from an MCU, and turn on or turn off respective transistors 11 and 12 in accordance with the received PWM control signals. For example, during the turn-on process of a respective transistor 11 or 12, the gate driver IC 20A may be used to provide (source) a gate current to the gate of the respective transistor 11/12 in order to charge the gate. In contrast, during the turn-off process, the gate driver IC 20A may be used to draw (sink) a gate current from the gate of the transistor 11/12 in order to discharge the gate.

Thus, the MCU is electrically coupled to the gate driver IC 20A for the transmission of information signals and control signals HIN and LIN therebetween, and the gate driver IC 20A is electrically coupled to the inverter leg 10 for driving the power transistors thereof.

Specifically, the MCU is configured to generate PWM control signals LIN and HIN for controlling the transistors 11 and 12, respectively, and transmit the control signals to the gate driver IC 20A at the LV domain 43. For example, the gate driver IC 20A is configured to receive instructions from the MCU to drive a load phase (i.e., an inverter leg)

connected to voltage VS using the PWM control signals. These PWM control signals are received by the gate driver IC 20A at the LV domain (i.e., at input pins HIN and LIN) and passed through to the corresponding pre-driver circuitry 26 and 27 via the appropriate logic (e.g., the PWM logic 35 and, for the high-side, the level shifter 25). The buffers 33 and 34 are configured to receive the PWM control signals and drive the corresponding power transistor 11 and 12 via output terminals HO and LO of the gate driver IC 20A.

At least four regions, a HV domain 41, a medium-voltage domain (MV) domain 42 or mid-voltage domain, a LV domain 43, and a termination region 44 are monolithically built in a single integrated circuit. The LV domain 43 is a region that includes low-voltage devices, the MV domain 42 is a region that includes mid-voltage devices, and the HV domain 41 is a region that includes high-voltage devices. For example, low-voltage devices may be supplied with 0-5V, mid-voltage devices may be supplied with 0-30V, and high-voltage devices may be supplied with over 100 volts (e.g., 120V-160V). The voltage domains are not limited to these voltage ranges, but are instead intended to provide an example of one implementation. Nevertheless, general principle of different voltage domain levels at different voltage hierarchies remains intact.

The termination region 44 is represented by the dotted line between the different voltage domains. The termination region 44 isolates the different voltage domains from each other, and may be referred to as an isolation termination region. Thus, the termination region 44 provides a voltage isolation barrier between the two voltage domains. The termination region 44 may be a unitary contiguous region or it may comprise two or more regions that are used to separate the various voltage domains.

While FIG. 2 shows an example comprising three isolated voltage domains, some embodiments may have a configuration in which there is no isolation between the MV domain 42 and the LV domain 43. In other words, the portion of the termination region 44 between the MV domain 42 and the LV domain 43 shown in FIG. 2 may not be present. In this case, the termination region 44 remains between the HV domain 41 and the other voltage domains 42 and 43 in order to isolate the HV domain 41 therefrom.

In addition, some embodiments may have a configuration in which the LV domain 43 is arranged entirely within the MV domain 42. In this case, the LV domain 43 may be a voltage island completely enclosed by a termination region 44 in order to isolate the LV domain 43 from the MV domain 42. Additionally, a termination region 44 remains between the HV domain 41 and the MV voltage domain 42 in order to isolate the HV domain 41 from the MV domain 42. Accordingly, the LV domain 43 is isolated from the MV domain 42, and the HV domain 41 is isolated from the MV domain 42. In naturally follows that the LV domain 43 and the HV domain 41 are also isolated from each other by two separate termination regions 44.

Furthermore, while FIG. 2 shows an example comprising three voltage domains, it will be appreciated that the number of voltage domains can be reduced to two. In this case, respective components of the MV domain 42 and the LV domain 43 may be combined into the same voltage domain (e.g., an LV domain or an MV domain) such that they are incorporated into a same voltage region. The remaining region may comprise the HV domain 41 as shown in FIG. 2 that is isolated from the other voltage domain.

All four regions 41-44 are built on a single silicon die to create a single IC gate driver. The main purpose of the termination region 44, which may be arranged as discussed above, is to electrically isolate the different voltage domains from each other. The termination region 44 may include a large diode (not illustrated) usually used as bootstrap diode to charge a bootstrap capacitor 24. The level shifter 25 is used to convert (i.e., level shift) the voltage level of control signals, and thus transfer control information, from the low voltage/power domain to the high voltage/power domain.

In addition, VB refers to the high-side floating supply voltage; VS refers to the high-side floating ground voltage; VDD or VCC refers to the low-side and logic fixed supply voltage; VSS or VEE refers to a low-side ground voltage; HO refers to the high-side floating output voltage; LO refers to the low-side output voltage; DC+ refers to DC-link positive; DC− refers to DC-link negative; and HIN and LIN refers to the logic input voltages (i.e., control signals) received from the MCU.

In this and the following examples, VB operates at a maximum of 160V, VS operates at a maximum of 130V, VCC operates at 30V, and VSS operates at 0V. In particular, VS is equal to DC+ when transistor 12 is on (and transistor 11 is off) and equal to DC− when transistor 11 is on (and transistor 12 is off). In both cases, VB remains at substantially 30V above VS due to the bootstrap capacitor 24. Thus, the low-side (external) supply voltage that supplies VCC may be set to 30V and the high-side supply voltage VB may be operated at a maximum voltage of 160V when DC+ is 130V. DC− is tied to ground/VSS but does not have to be.

It is also noted that the voltage difference between VB and VS is substantially equal to the voltage difference between VCC and VSS. As a result, LO is modulated between 0V and 30V and HO is modulated between 130V and 160V. In some implantations VS may operate as high as 140V and VCC may operate as low as 20V. Other implementations may use other voltage settings for each pad of the IC.

The aforementioned voltages are set such that the high-side voltage domain operates in a higher voltage or power domain than that of the low-side voltage domain. In addition, the medium-voltage or power domain is set at an intermediate level between the HV domain and the LV domain.

The HV domain 41 includes pre-driver circuitry 27, buffer 34, and a MV ESD device 51 coupled to VS and VB.

The LV domain 43 includes PWM logic 35 and dead time logic 36. The level shifter 25 spans across the termination region 44 between the HV domain 41 and the LV domain 43.

The MV domain 42 includes pre-driver circuitry 26 and buffer 33. It also includes a power management unit (PMU) 37 that is supplied by VSS and VCC. The PMU 37 includes circuitry that governs and regulates power functions and converts the medium supply voltage (i.e., VCC) to a low supply voltage (e.g., 5V) that is supplied to the LV domain 43. In particular, PMU 37 supplies the low supply voltage to the PWM logic 35. The PWM logic 35 uses the low supply voltage to perform its functions. Secondly, the PMU 37 is configured to monitor for faults and turn off the supply to the PWM logic 35 in the event an event occurs. By turning off the supply to the PWM logic 35, the PWM logic 35 is disabled and the high-side transistor 12 is turned off.

The MV domain 42 further includes an MV ESD device 52 coupled to VSS and VCC and an HV ESD device 53 coupled to VSS and VS. As a result of the HV ESD device 53 being connected to VS, the HV ESD device 53 and the MV ESD device 51 are coupled together in series to form a chain of ESC devices.

This configuration uses two ESD devices 51 and 53 in series such that the MV ESD device 51 shares HV ESD protection with the HV ESD device 53. The HV ESD device 53 protects a floating voltage domain tied to the high-side floating ground voltage VS and additionally assists the MV ESD device 51 to protect the HV domain 41. When used in this manner, the HV domain 41 is protected by using two smaller ESD devices than would have been required if a single, dedicated ESD device was used to protect the HV domain 41. The silicon area of the two ESD devices 51 and 53 required on the chip is less than a total area that would have been required if a single, dedicated ESD device was used to protect each voltage domain separately. Thus, the configuration in the present example is able to save some area because the HV ESD protection is being shared between two voltage domains. Thus, both savings in area and cost can be realized using this configuration. Furthermore, the MV ESD device 52 is used to protect the MV domain 42.

It is noted that the ESD devices 51, 52, and 53 are voltage level triggered devices, as opposed to being edge triggered devices. In other words, ESD protection is triggered by an ESD device when the voltage across the ESD device reaches a threshold level (e.g., 30V or some other delta voltage). When the threshold voltage is reached, the clamp is activated. This in contrast to edge triggered, which triggers an ESD protection when a slope of a voltage increase across the device exceeds a slope threshold (e.g., 30V/us). Fast movements in voltage changes are typical in gate driver applications. Thus, edge triggered devices may result in frequent and unwanted clamping caused by these fast voltage movements. Using voltage level triggered devices prevents unwanted clamping by setting a threshold voltage level that must be reached before clamping is activated.

The ESD devices 51, 52, and 53 may be silicon controlled rectifier (SCR)-based devices. Thus, the ESD devices 51, 52, and 53 include circuitry configured for voltage level triggered ESD protection. For example, when there is a certain voltage across the protection device there is a snapback effect that causes a voltage clamping. As a result, the circuitry connected in parallel to the corresponding ESD device providing the ESD protection is saved.

Figure 3A:
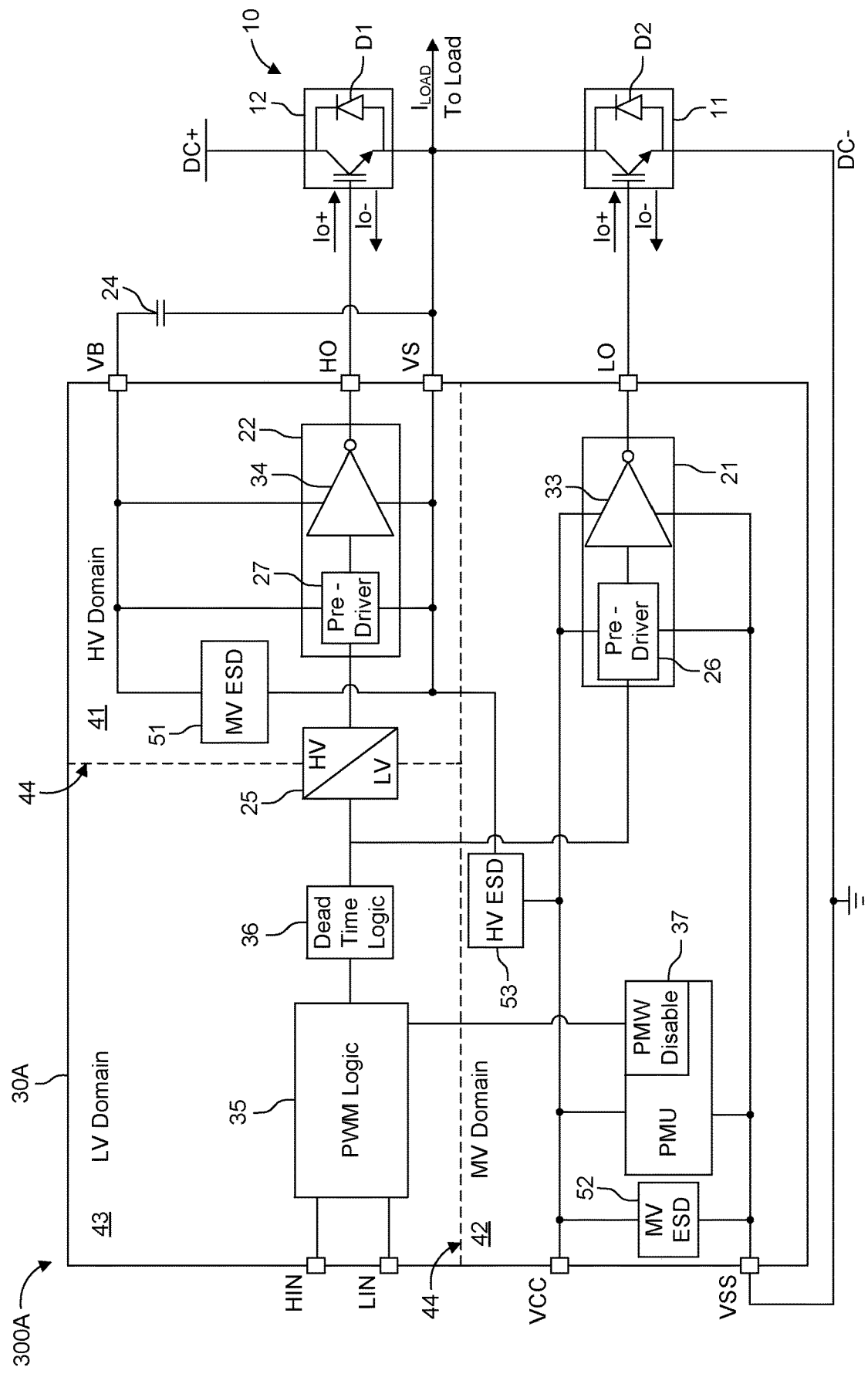
FIG. 3A is a schematic block diagram of a second power module according to one or more embodiments.

FIG. 3A is a schematic block diagram of a power module 300A according to one or more embodiments. The power module 300A is similar to power module 200A, with the exception that the gate driver IC 30A has its HV ESD device 53 connected to VCC instead of to VSS. As a result of the HV ESD device 53 being connected to VS and to VCC, the HV ESD device 53, the MV ESD device 51, and the MV device 52 are coupled together in series to form a chain of ESC devices.

This configuration uses three ESD devices 51, 52, and 53 in series such that the MV ESD device 51 shares HV ESD protection with a second ESD device 53 and a third ESD device 52. The HV ESD device 53 protects the floating voltage domain tied to the high-side floating ground voltage VS and additionally assists the MV ESD device 51 to protect the HV domain 41. Additionally, the MV ESD device 52 protects the MV domain 42 as well as assists in protecting the HV domain 41.

When used in this manner, the HV domain 41 is protected by using three smaller ESD devices than would have been required if a single ESD device was used to protect the HV domain 41. The silicon area of the three ESD devices 51, 52, and 53 required on the chip is less than a total area that would have been required if a single, dedicated ESD device was used to protect each voltage domain separately. In contrast, the configuration in the present example is able to save some area because the HV ESD protection is being shared between two voltage domains. Thus, both savings in area and cost can be realized using this configuration.

Aside from this difference, the configuration of the gate driver IC 30A is the same as the configuration of the gate driver IC 20A.

Figure 3B:
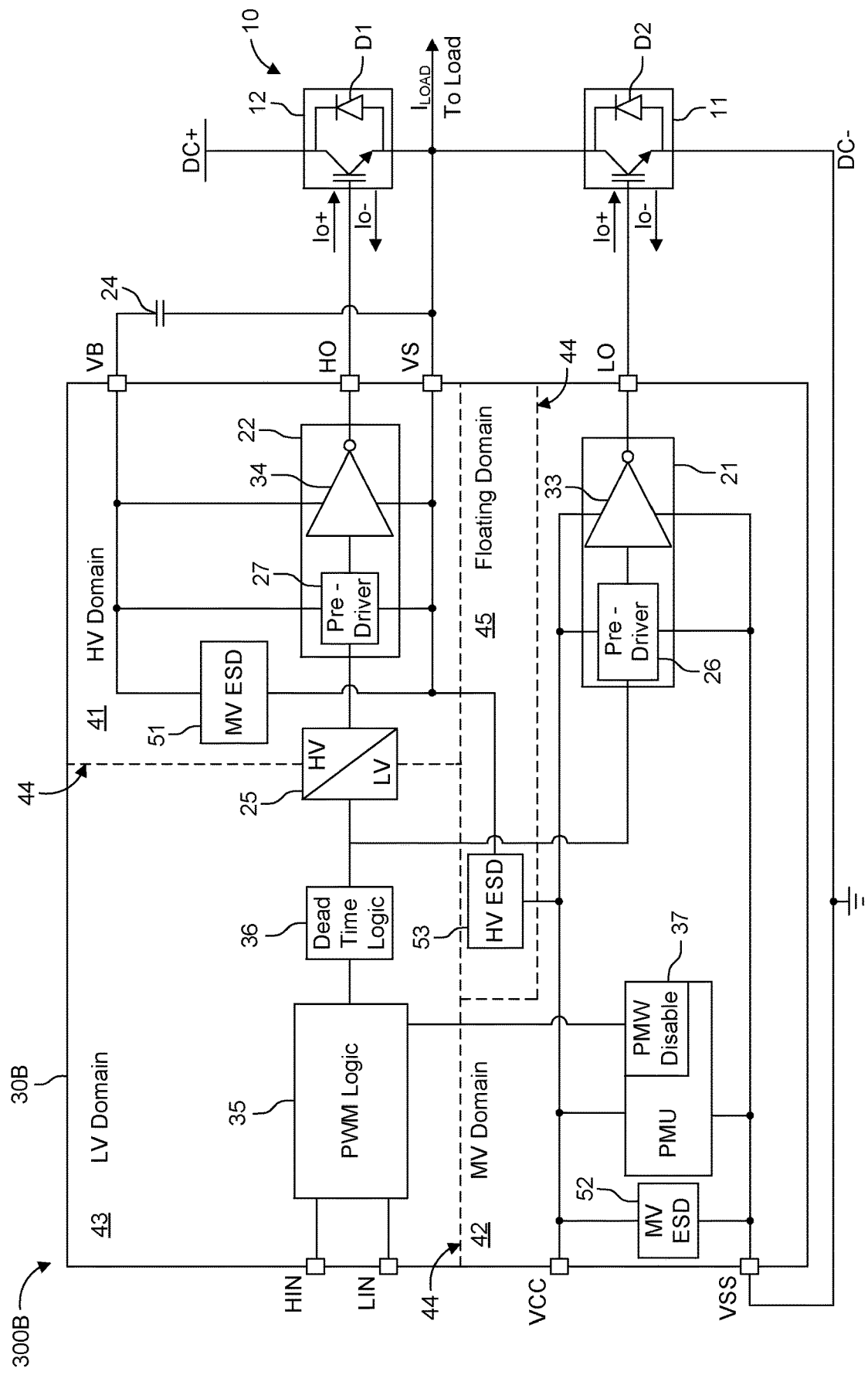
FIG. 3B is a schematic block diagram of a third power module according to one or more embodiments.

FIG. 3B is a schematic block diagram of a power module 300B according to one or more embodiments. The power module 300B is similar to power module 300A, with the exception that the gate driver IC 30B includes an additional voltage domain, floating voltage (FV) domain 45. The FV domain 45 includes the HV ESD device 53 and is isolated from the other voltage domains 41, 42, and 43 by the termination region 44. The FV domain 45 includes voltage levels that float between the MV domain 42 and the HV domain 41. Aside from these differences, the configuration of the gate driver IC 30B is the same as the configuration of the gate driver IC 30A.

Embodiments further include a method of operating a gate driver integrated circuit, including operating at least one high-side device in a first voltage domain according to a first pair of supply terminals that include a first lower supply terminal and a first higher supply terminal; operating at least one low-side device in a second voltage domain lower than the first voltage domain according to a second pair of supply terminals that include a second lower supply terminal and a second higher supply terminal; operating at least one low-voltage device in a third voltage domain lower than the second voltage domain, wherein the high-side region is isolated from the low-side region and the low-voltage region; providing a first electrostatic protection to the at least one high-side device based on a first electrostatic device arranged in the first voltage domain and connected to the first pair of supply terminals and based on a second electrostatic device connected to the first lower supply terminal of the first pair of supply terminals such that the third electrostatic device is coupled in series with the first electrostatic device; and providing a second electrostatic protection to the at least one low-side device based on a third electrostatic device arranged in the second voltage domain and connected to the second pair of supply terminals.

Embodiments further include methods of manufacturing any of the described embodiments. The methods of manufacturing include forming the different regions according to their voltage domains, forming one or more termination regions where at least the high-side region is isolated from the low-side region and the low-voltage region, and providing the corresponding circuitry in each region/voltage domain. The circuitry includes the ESD devices 51, 52, and 53 electrically connected in the manner described above in conjunction with FIGS. 2, 3A, and 3B.

For example, a method of manufacturing a gate driver integrated circuit may include forming a high-side region that operates in a first voltage domain according to a first pair of supply terminals that include a first lower supply terminal and a first higher supply terminal; forming a low-side region that operates in a second voltage domain lower than the first voltage domain according to a second pair of supply terminals that include a second lower supply terminal and a second higher supply terminal; forming a low-voltage region the operates in a third voltage domain lower than the second voltage domain; forming at least one termination region that electrically isolates the high-side region from the low-side region and the low-voltage region; providing a first electrostatic device arranged in the high-side region and connected to the first pair of supply terminals; providing a second electrostatic device arranged in the low-side region and connected to the second pair of supply terminals; and providing a third electrostatic device connected to the first lower supply terminal of the first pair of supply terminals such that the third electrostatic device is coupled in series with the first electrostatic device.

While various embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent on the independent claim.

It is further to be noted that methods disclosed in the specification or in the claims may be implemented by a device having means for performing each of the respective acts of these methods. For example, the techniques described in this disclosure may be implemented, at least in part, in hardware, software, firmware, or any combination thereof, including any combination of a computing system, an integrated circuit, and a computer program on a non-transitory computer-readable recording medium. For example, various aspects of the described techniques may be implemented within one or more processors, including one or more microprocessors, DSPs, ASICs, or any other equivalent integrated or discrete logic circuitry, as well as any combinations of such components.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments, a single act may include or may be broken into multiple sub acts. Such sub acts may be included and part of the disclosure of this single act unless explicitly excluded.

What is claimed is:

1. A gate driver integrated circuit, comprising:
   a high-side region that operates in a first voltage domain according to a first pair of supply terminals that include a first lower supply terminal and a first higher supply terminal;
   a low-side region that operates in a second voltage domain lower than the first voltage domain according to a second pair of supply terminals that include a second lower supply terminal and a second higher supply terminal;
   a low-voltage region that operates in a third voltage domain lower than the second voltage domain;
   at least one termination region that electrically isolates the high-side region from the low-side region and the low-voltage region;
   a first electrostatic device arranged in the high-side region and connected to the first pair of supply terminals;
   a second electrostatic device arranged in the low-side region and connected to the second pair of supply terminals; and
   a third electrostatic device connected to the first lower supply terminal of the first pair of supply terminals such that the third electrostatic device is coupled in series with the first electrostatic device.

2. The gate driver integrated circuit of claim 1, wherein the first electrostatic device has a first voltage rating, the second electrostatic device has the first voltage rating, and the third electrostatic device has a second voltage rating greater than the first voltage rating.

3. The gate driver integrated circuit of claim 2, wherein the first voltage rating is less than 100V and the second voltage rating is at least 100V.

4. The gate driver integrated circuit of claim 3, wherein the first voltage rating is 30V or less.

5. The gate driver integrated circuit of claim 1, wherein the third electrostatic device is connected to the second lower supply terminal of the second pair of supply terminals.

6. The gate driver integrated circuit of claim 1, wherein the third electrostatic device is connected to the second higher supply terminal of the second pair of supply terminals such that the third electrostatic device is coupled in series with both the first electrostatic device and the second electrostatic device.

7. The gate driver integrated circuit of claim 6, wherein the third electrostatic device is coupled between the first electrostatic device and the second electrostatic device.

8. The gate driver integrated circuit of claim 6, wherein the first electrostatic device has a first voltage rating, the second electrostatic device has the first voltage rating, and the third electrostatic device has a second voltage rating greater than the first voltage rating.

9. The gate driver integrated circuit of claim 1, further comprising:
   a high-side gate driver disposed in the high-side region and connected to the first pair of supply terminals, wherein the high-side gate driver is configured to generate an on-current during a plurality of turn-on switching events to drive a high-side transistor;
   a low-side gate driver disposed in the low-side region and connected to the second pair of supply terminals, wherein the low-side gate driver is configured to drive a low-side power transistor complementary to the high-side power transistor; and
   a pulse width modulator (PWM) logic circuit disposed in the low-voltage region, wherein the PWM logic circuit is configured to receive high-side PWM control signals and low-side PWM control signals, transmit the high-side PWM control signals to the high-side gate driver, and transmit the low-side PWM control signals to the low-side gate driver.

10. The gate driver integrated circuit of claim 9, further comprising:
    a power management unit disposed in the low-side region and connected to the second pair of supply terminals, wherein the power management unit is configured to convert a voltage received from the second higher supply terminal into a lower voltage and supply the lower voltage to the PWM logic circuit.

11. The gate driver integrated circuit of claim 10, wherein the power management unit is configured to monitor for a fault and, on a condition the fault is detected, disable supplying the lower voltage to the PWM logic circuit.

12. The gate driver integrated circuit of claim 1, further comprising:
a floating voltage region that operates in a floating voltage domain between the first voltage domain and the second voltage domain,
wherein the at least one termination region electrically isolates at least the high-side region, the low-side region, and the floating voltage region from each other, and
wherein the third electrostatic device is disposed in the floating voltage region.

13. The gate driver integrated circuit of claim 12, wherein the at least one termination region electrically isolates the high-side region, the low-side region, the low-voltage region, and the floating voltage region from each other.

14. The gate driver integrated circuit of claim 12, wherein the third electrostatic device is connected to the second lower supply terminal of the second pair of supply terminals.

15. The gate driver integrated circuit of claim 12, wherein the third electrostatic device is connected to the second higher supply terminal of the second pair of supply terminals such that the third electrostatic device is coupled in series with both the first electrostatic device and the second electrostatic device.

16. The gate driver integrated circuit of claim 15, wherein the third electrostatic device is coupled between the first electrostatic device and the second electrostatic device.

17. The gate driver integrated circuit of claim 15, wherein the first electrostatic device has a first voltage rating, the second electrostatic device has the first voltage rating, and the third electrostatic device has a second voltage rating greater than the first voltage rating.

18. The gate driver integrated circuit of claim 1, wherein the gate driver integrated circuit is a monolithic gate driver integrated circuit.

19. The gate driver integrated circuit of claim 1, wherein the first electrostatic device, the first electrostatic device, and the first electrostatic device are silicon controlled rectifiers.

20. The gate driver integrated circuit of claim 1, wherein the first electrostatic device, the first electrostatic device, and the first electrostatic device include at least one Zener diode.

21. The gate driver integrated circuit of claim 1, wherein:
the first lower supply terminal is configured to receive a high-side floating ground voltage,
the first higher supply terminal is configured to receive a high-side floating supply voltage,
the second lower supply terminal is configured to receive a low-side ground voltage, and
second higher supply terminal is configured to receive a low-side fixed supply voltage.

22. The gate driver integrated circuit of claim 1, wherein the at least one termination region electrically isolates the high-side region, the low-side region, and the low-voltage region from each other.

23. The gate driver integrated circuit of claim 1, wherein the third electrostatic device is arranged in the low-side region.

24. A method of operating a gate driver integrated circuit, the method comprising:
operating at least one high-side device in a first voltage domain according to a first pair of supply terminals that include a first lower supply terminal and a first higher supply terminal;
operating at least one low-side device in a second voltage domain lower than the first voltage domain according to a second pair of supply terminals that include a second lower supply terminal and a second higher supply terminal;
operating at least one low-voltage device in a third voltage domain lower than the second voltage domain, wherein the high-side region is isolated from the low-side region and the low-voltage region;
providing a first electrostatic protection to the at least one high-side device based on a first electrostatic device arranged in the first voltage domain and connected to the first pair of supply terminals and based on a second electrostatic device connected to the first lower supply terminal of the first pair of supply terminals such that the third electrostatic device is coupled in series with the first electrostatic device; and
providing a second electrostatic protection to the at least one low-side device based on a third electrostatic device arranged in the second voltage domain and connected to the second pair of supply terminals.

25. The method of claim 24, wherein the high-side region, the low-side region, and the low-voltage region are electrically isolated from each other.

* * * * *